(12) United States Patent
Boskamp

(10) Patent No.: US 6,522,144 B2
(45) Date of Patent: Feb. 18, 2003

(54) RF SHIELDING METHOD AND APPARATUS FOR AN OPEN MRI SYSTEM

(75) Inventor: Eddy B. Boskamp, Menomonee Falls, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/746,931

(22) Filed: Dec. 22, 2000

(65) Prior Publication Data

US 2002/0079894 A1 Jun. 27, 2002

(51) Int. Cl.[7] ................................. G01V 3/00
(52) U.S. Cl. ....................... 324/318; 324/322
(58) Field of Search ................... 324/318, 322, 324/307, 309

(56) References Cited

U.S. PATENT DOCUMENTS

| | | | | |
|---|---|---|---|---|
| 4,878,024 A | * | 10/1989 | Overweg et al. | 324/319 |
| 5,227,728 A | * | 7/1993 | Kaufman et al. | 324/322 |
| 5,952,830 A | * | 9/1999 | Petropoulos et al. | 324/318 |
| 6,078,177 A | * | 6/2000 | Petropoulos et al. | 324/318 |
| 6,144,204 A | * | 11/2000 | Sementchenko | 324/318 |
| 6,163,240 A | * | 12/2000 | Zuk et al. | 324/318 |
| 6,215,307 B1 | * | 4/2001 | Sementchenko | 324/318 |
| 6,249,121 B1 | * | 6/2001 | Boskamp et al. | 324/318 |
| 6,262,576 B1 | * | 7/2001 | Petropoulos | 324/318 |
| 6,278,275 B1 | * | 8/2001 | Petropoulos et al. | 324/318 |
| 6,278,276 B1 | * | 8/2001 | Morich et al. | 324/318 |
| 6,320,385 B1 | * | 11/2001 | Burl et al. | 324/322 |

* cited by examiner

*Primary Examiner*—Edward Lefkowitz
*Assistant Examiner*—Dixomara Vargas
(74) *Attorney, Agent, or Firm*—Fletcher, Yoder & Van Someren

(57) ABSTRACT

An RF shielding technique is provided for open MRI systems. The RF shield includes a first portion disposed over a gradient field generating set, and a skirt-like second portion that wraps around lateral structures, such as the primary magnet and support. The two portions are joined to one another to form an integral RF shield that limits loss of RF energy both through the gradient field elements and through the primary magnet and support structures.

30 Claims, 3 Drawing Sheets

RF SHIELDING METHOD AND APPARATUS FOR AN OPEN MRI SYSTEM

FIELD OF THE INVENTION

The present invention relates generally to the field of magnetic resonance imaging systems and, more particularly, to the shielding of RF magnetic fields in an open MRI system.

BACKGROUND OF THE INVENTION

Magnetic resonance imaging (MRI) systems have become ubiquitous in the field of medical diagnostics. Over the past decades, improved techniques for MRI examinations have been developed that now permit very high quality images to be produced in a relatively short time. As a result, diagnostic images with varying degrees of resolution are available to the radiologist that can be adapted to particular diagnostic applications.

In general, MRI examinations are based on the interactions among a primary magnetic field, a radio frequency (RF) magnetic field and time varying magnetic field gradients with nuclear spins within the subject of interest. The nuclear spins, such as hydrogen nuclei in water molecules, have characteristic behaviors in response to external magnetic fields. The precession of such nuclear spins can be influenced by manipulation of the fields to obtain RF signals that can be detected, processed, and used to reconstruct a useful image.

The magnetic fields used to produce images in MRI systems include a highly uniform, primary magnetic field that is produced by a magnet. A series of gradient fields are produced by a set of three coils disposed around the subject. The gradient fields encode positions of individual volume elements or voxels in three dimensions. A radio frequency coil is employed to produce an RF magnetic field. This RF magnetic field perturbs the spin system from its equilibrium direction, causing the spins to precess around the axis of their equilibrium magnetization. During this precession, radio frequency fields are emitted by the spins and detected by either the same transmitting RF coil, or by a separate receive-only coil. These signals are amplified, filtered, and digitized. The digitized signals are then processed using one of several possible reconstruction algorithms to form a final image.

Many specific techniques have been developed to acquire MR images for a variety of applications. One major difference among these techniques is in the way gradient pulses and RF pulses are used to manipulate the spin systems to yield different image contrasts, signal-to-noise ratios, and resolutions. Graphically, such techniques are illustrated as "pulse sequences" in which the pulses are represented along with temporal relationships among them. In recent years, pulse sequences have been developed which permit extremely rapid acquisition of a large amount of raw data. Such pulse sequences permit significant reduction in the time required to perform the examinations. Time reductions are particularly important for acquiring high resolution images, as well as for suppressing motion effects and reducing the discomfort of patients in the examination process.

In addition to the foregoing developments, new system designs have been developed which allow for greater patient comfort during examination procedures. In one system design, commonly referred to as an opened MRI system, the conventional tubular patient volume defined by the primary magnet and the gradient coils is opened substantially laterally to provide for a greater feeling of space and to reduce patient anxiety. To accommodate the more open patient volume, the conventional tubular magnet and coil structures are separated into a pair of structures which flank the patient volume, typically in upper and lower positions, with a gap provided between the magnet and coil structures. In certain systems, the pair of magnet and coils structures may be provided in a side-by-side arrangement.

Open MRI system design poses a number of technical difficulties both in terms of component design and layout, and in the appropriate control of the system to obtain high-quality image data. For example, because the primary magnet and gradient coils no longer surround the patient in the same manner as in more conventional tubular structures, the entire design of the magnet and coils must be reconsidered to provide the predictable uniform fields needed for encoding the gyromagnetic materials of the patient for image data acquisition, processing and reconstruction. In general, the entire structure of the gradient magnetic field-producing elements is modified to allow for production of the gradient fields and to allow their orientation along desired physical axes for production of images similar to those obtainable on more conventional systems.

The present technique stems from a realization that interactions between the various magnetic fields produced during an examination procedure may adversely affect the performance of the system components as well as the image data obtained. For example, the proximity of an RF magnetic field-producing element and gradient magnetic field-producing elements on either side of the patient volume may lead to field interactions which are undesirable or may lead to degradation in the image data. Specifically, when appropriate pulses are applied to an RF magnetic field-producing element during an examination sequence, RF energy from the RF field element may penetrate the gradient field elements or the core or associated structures of the primary magnet where it is dissipated due to the lossy medium or to field interaction. To maintain a high efficiency of the RF field element, then, an RF shield may be applied between the RF field element and the gradient field elements or primary magnet components. Such shields do serve to prevent or reduce penetration of the RF magnetic field into the gradient field elements and primary magnet components. However, it has been found that the RF energy can still be dissipated in conventional designs.

There is a need, therefore, for an improved RF shielding technique specifically designed for open MRI systems. There is, at present, a particular need for a technique which will allow for enhanced RF shielding without significant redesign of the structures defining the primary magnet and gradient field elements in existing open MRI designs.

SUMMARY OF THE INVENTION

The present invention provides a novel technique for RF shielding in open MRI systems designed to respond to such needs. The technique may be employed in newly-designed systems, but may also be retrofitted into existing designs during regular or special maintenance or enhancement procedures. The technique improves upon RF shield designs which could allow for potentially significant loss of RF energy through incomplete or inadequate RF shielding.

In an exemplary implementation of the present technique, an RF shield is provided in one or both field sets of an MRI system, with each field set including a primary magnet element and gradient field-producing elements. The RF shield includes a first member or members which cover the gradient field elements, such as by extending over a face of the elements adjacent to the patient volume. The shield also includes a skirt-like element which extends laterally around the structures, particularly around the primary magnet, its core, and the associated support structures. The elements of the RF shield may be joined to one another by a conductive extensions or fingers to facilitate fabrication. The resulting shield structure therefore forms a shroud or cap which prevents or substantially inhibits loss of the RF energy both through a face of the gradient field element assembly and around a side of the assembly and the primary magnet.

DETAILED DESCRIPTION OF THE INVENTION

Figure 1:
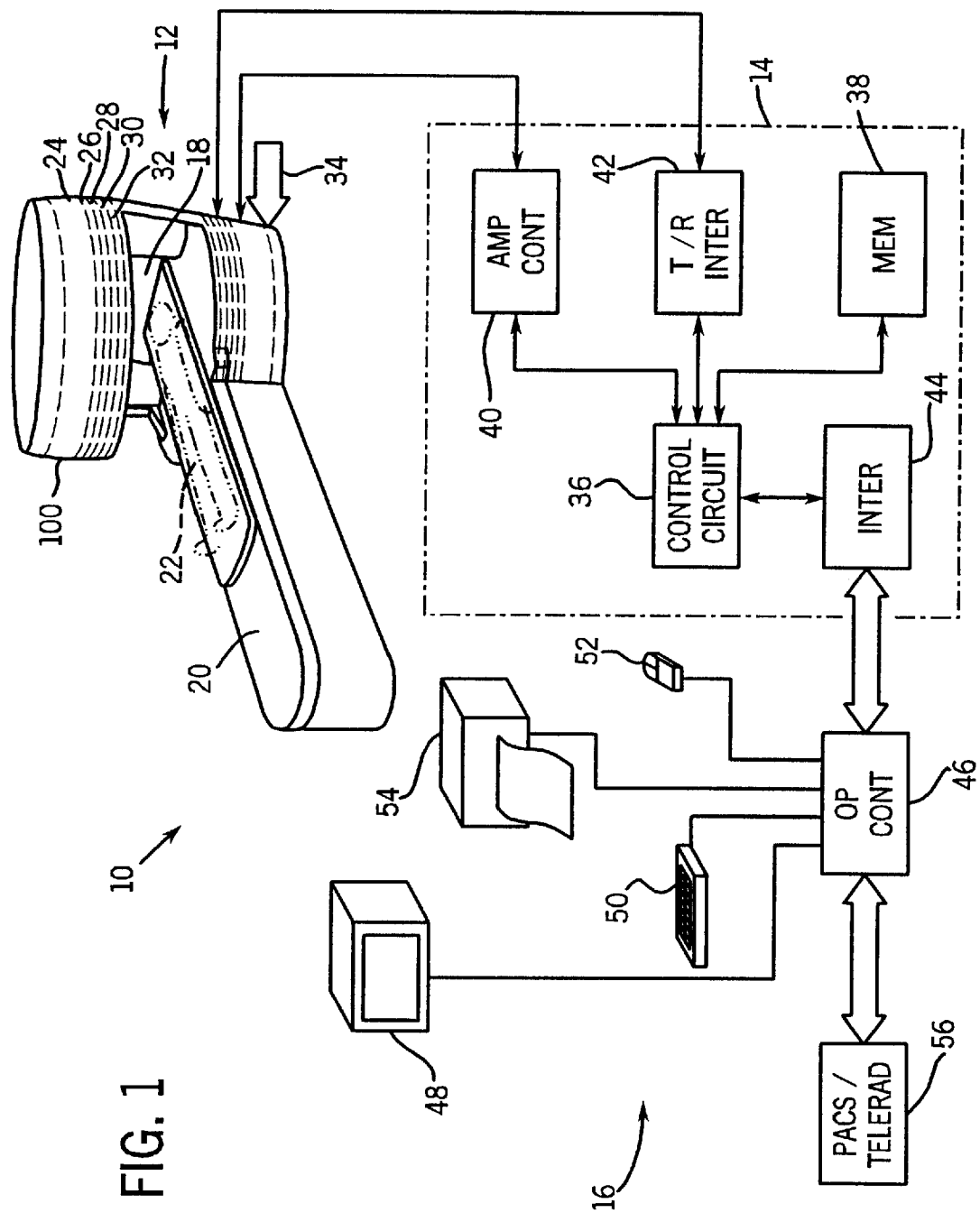
FIG. 1 is a diagrammatical representation of an open MRI system for use in medical diagnostic imaging and implementing certain aspects of the present invention.

Turning now to the drawings, and referring first to FIG. 1, an open magnetic resonance imaging (MRI) system 10 is illustrated diagrammatically as including a scanner 12, scanner control circuitry 14, and system control circuitry 16. While open MRI system 10 may include any suitable MRI scanner or detector, in the illustrated embodiment the system includes a vertical scanner comprising a patient volume 18 into which a table 20 may be positioned to place a patient 22 in a desired position for scanning. Scanner 12 includes upper and lower field-generating structures for producing a primary magnetic field and a set of gradient fields as described below.

Scanner 12 includes a series of associated field elements for producing controlled magnetic fields, for generating radio frequency excitation fields, and for detecting emissions from gyromagnetic material within the patient in response to such fields. In the diagrammatical view of FIG. 1, a primary magnet coil 24, divided between the upper and lower structures, is provided for generating a primary magnetic field across the patient volume 18. A series of gradient field elements 26, 28 and 30 are grouped in a gradient field element assembly within the upper and lower structures for generating controlled magnetic gradient fields during examination sequences as described more fully below. A radio frequency magnetic field element 32 is provided in each structure for generating radio frequency pulses for exciting the gyromagnetic material. In the embodiment illustrated in FIG. 1, RF elements 32 also serve as receiving elements. Thus, RF element 32 may be coupled with driving and receiving circuitry in passive and active modes for receiving emissions from the gyromagnetic material and for outputting radio frequency excitation pulses, respectively. Alternatively, various configurations of receiving elements may be provided separate from RF field element 32. Such elements may include structures specifically adapted for target anatomies, such as head assemblies, and so forth. Moreover, receiving elements may be provided in any suitable physical configuration, including phased array elements, and so forth.

The field generating elements of scanner 12 are controlled by external circuitry to generate desired fields and pulses, and to read emissions from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner and processed for reconstruction of the desired image.

Gradient field elements 26, 28 and 30 of both the upper and lower structures serve to generate precisely controlled magnetic fields, the strength of which vary over a predefined field of view, typically with positive and negative polarity. When each element is energized with known electric current and frequency, the resulting magnetic field gradient is superimposed over the primary field and produces a linear variation in the overall magnetic field strength across the field of view. Combinations of such fields, orthogonally disposed with respect to one another, enable the creation of a linear gradient in any direction by vector addition of the individual gradient fields.

The gradient fields may be considered to be oriented both in physical planes, as well as by logical axes. In the physical sense, the fields are mutually orthogonally oriented to form a coordinate system which can be rotated by appropriate manipulation of the pulsed current applied to the individual field elements. In a logical sense, the coordinate system defines gradients which are typically referred to as slice select gradients, frequency encoding gradients, and phase encoding gradients.

The slice select gradient determines a slab of tissue or anatomy to be imaged in the patient. The slice select gradient field may thus be applied simultaneous with a selective RF pulse to excite a known volume of spins within a desired slice that precess at the same frequency. The slice thickness is determined by the bandwidth of the RF pulse and the gradient strength across the field of view.

A second logical gradient axis, the frequency encoding gradient axis is also known as the readout gradient axis, and is applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position across the gradient field. By Fourier transformation, acquired signals may be analyzed to identify their location in the selected slice by virtue of the frequency encoding.

Finally, the phase encode gradient is generally applied in a sequence before the readout gradient and after the slice select gradient. Localization of spins in the gyromagnetic material in the phase encode direction is accomplished by sequentially inducing variations in phase of the precessing protons of the material by using slightly different gradient amplitudes that are sequentially applied during the data acquisition sequence. Phase variations are thus linearly imposed across the field of view, and spatial position within the slice is encoded by the polarity and the degree of phase difference accumulated relative to a null position. The phase encode gradient permits phase differences to be created among the spins of the material in accordance with their position in the phase encode direction.

As will be appreciated by those skilled in the art, a great number of variations may be devised for pulse sequences employing the logical axes described above. Moreover, adaptations in the pulse sequences may be made to appropriately orient both the selected slice and the frequency and phase encoding to excite the desired material and to acquire resulting MR signals for processing.

The elements of scanner 12 are controlled by scanner control circuitry 14 to generate the desired gradient and radio frequency magnetic fields. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the elements of scanner 12 is managed by amplification and control circuitry 40 and by transmission and receive interface circuitry 42. Circuitry 40 includes amplifiers for each gradient field element to supply drive current to the field elements in response to control signals from control circuit 36. Interface circuitry 42 includes additional amplification circuitry for driving RF field element 32. Moreover, where the RF element serves both to emit the radio frequency excitation fields and to receive MR signals, circuitry 42 will typically include a switching device for toggling the RF element between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a vertical arrangement with upper and lower structures flanking patient volume 18, and employing a superconducting primary field magnet assembly, the present technique may be applied to various other open MRI system configurations, such as scanners employing horizontal arrangements.

System control circuitry 16 may include a wide range of devices for facilitating interface between: an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Figure 2:
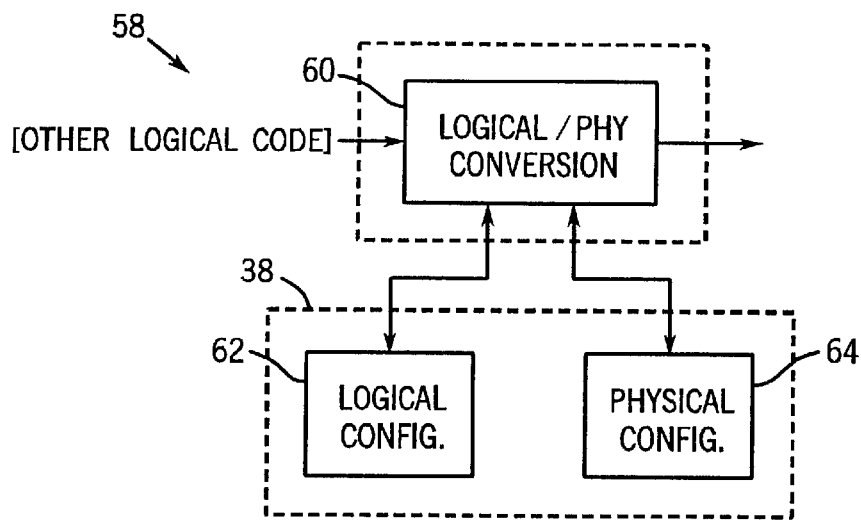
FIG. 2 is a block diagram of functional components of a pulse sequence description module in a controller for a system of the type illustrated in FIG. 1.

In general, the pulse sequences implemented in the open MRI system will be defined by both logical and physical configuration sets and parameter settings stored within control circuitry 14. FIG. 2 represents, diagrammatically, relationships between functional components of control circuit 36 and configuration components stored with memory circuitry 38. The functional components facilitate coordination of the pulse sequences to accommodate preestablished settings for both logical and physical axes of the system. In general, the axis control modules, denoted collectively by reference numeral 58, include a logical-to-physical module 60 which is typically implemented via software routines executed by control circuit 36. In particular, the conversion module is implemented through control routines which define particular pulse sequences in accordance with preestablished imaging protocols.

When called upon, code defining the conversion module references logical configuration sets 62 and physical configuration sets 64. The logical configuration sets may include parameters such as pulse amplitudes, beginning times, time delays, and so forth, for the various logical axes described above. The physical configuration sets, on the other hand, will typically include parameters related to the physical constraints of the scanner itself, including maximum and minimum allowable currents, switching times, amplification, scaling, and so forth. Conversion module 60 serves to generate the pulse sequence for driving the field elements of scanner 12 in accordance with constraints defined in these configuration sets. The conversion module will also serve to define adapted pulses for each physical axis to properly orient (e.g. rotate) slices and to encode gyromagnetic material in accordance with desired rotation or reorientations of the physical axes of the image.

Figure 3:
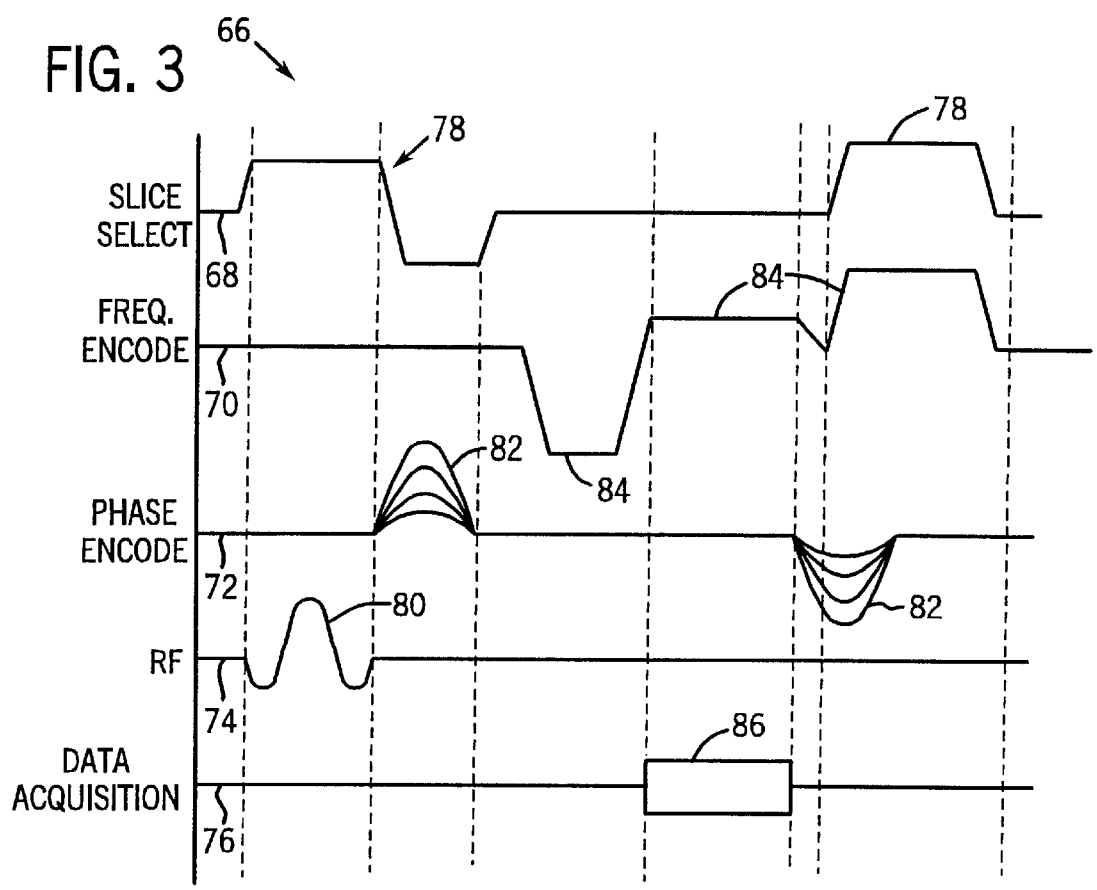
FIG. 3 is a graphical representation of an exemplary pulse sequence description for an MRI examination which may be implemented in the system of FIG. 1.

By way of example, FIG. 3 illustrates a typical pulse sequence which may be implemented on a system such as that illustrated in FIG. 1 and calling upon configuration and conversion components such as those shown in FIG. 2. While many different pulse sequence definitions may be implemented, depending upon the examination type, in the example of FIG. 3, a gradient recalled acquisition in steady state mode (GRASS) pulse sequence is defined by a series of pulses and gradients appropriately timed with respect to one another. The pulse sequence, indicated generally by reference numeral 66, is thus defined by pulses on a logical slice select axis 68, a frequency encoding axis 70, a phase encoding axis 72, an RF axis 74, and a data acquisition axis 76. In general, the pulse sequence description begins with a pair of gradient pulses on slice select axis 68 as represented at reference numeral 78. During a first of these gradient pulses, an RF pulse 80 is generated to excite gyromagnetic material in the subject. Phase encoding pulses 82 are then generated, followed by a frequency encoding gradient 84. A data acquisition window 86 provides for sensing signals resulting from the excitation pulses which are phase and frequency encoded. The pulse sequence description terminates with additional gradient pulses on the slice select, frequency encoding, and phase encoding axes.

Depending upon the orientation of the desired slice, and the strength of the fields desired, the logical configuration parameters of pulse sequence 66 may vary to provide faster or slower onset of the gradients, greater or lesser gradient amplitudes, various timings between the gradients, and so forth. Moreover, these logical configurations will be limited by physical configurations of the scanner and associated electronics.

During pulse sequences used in examinations, the interactions between the various fields produced are, of course, useful for encoding the locations of the gyromagnetic materials producing emissions. However, certain interactions of the fields with surrounding structures can lead to degradation of the fields and of the data collected. For example, the RF magnetic field produced by the RF elements 32 of both the upper and lower structures serves to excite the gyromagnetic material of the tissue to be imaged, but can be dissipated by surrounding structures. The gradient field element structures, in particular, are extremely lossy in nature at the RF frequency. Thus, if not shielded, the RF field energy can be lost in the gradient element structures. The RF energy can also be lost in surrounding structures, such as if the field is permitted to extend around edges of the gradient field elements. It has also been found that the RF energy can be lost in the materials surrounding the primary magnet, its core, and its support structures.

Figure 4:
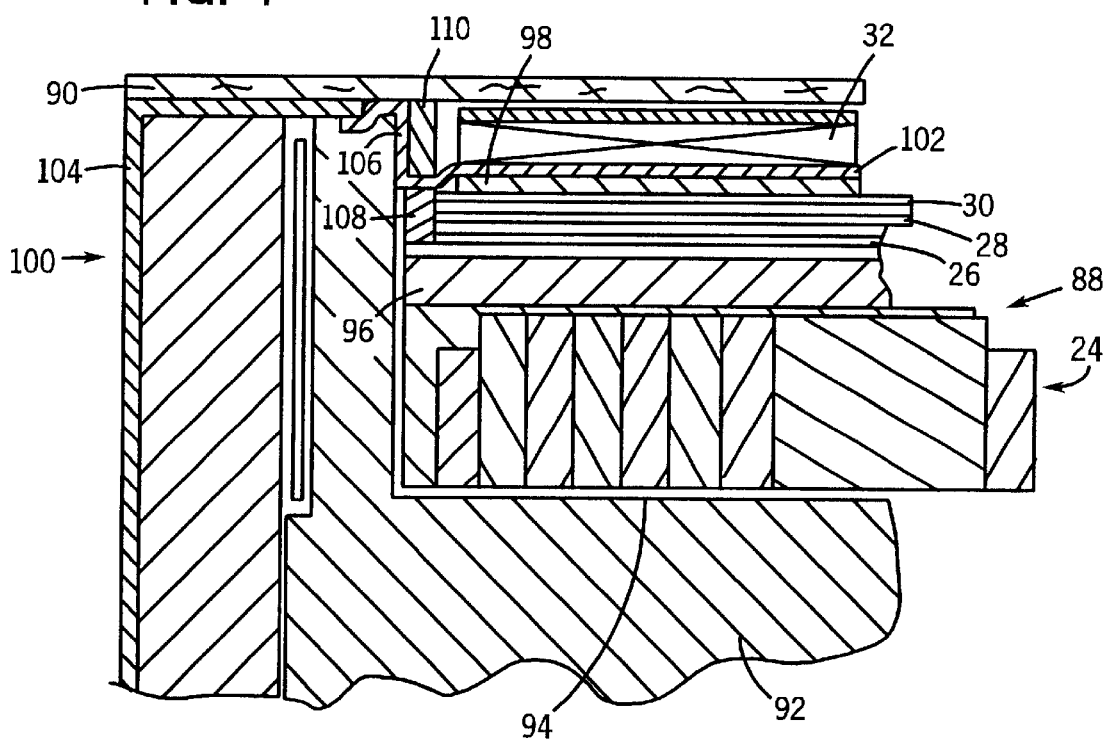
FIG. 4 is an exemplary sectional view of a gradient field element and primary magnet structure in a system of the type illustrated in FIG. 1 equipped with an RF shield in accordance with the present technique.

The present technique provides for shielding of the RF magnetic field in the open MRI scanner as best illustrated in FIG. 4. As shown in FIG. 4, the element assembly 88 includes the gradient field elements 26, 28 and 30 as described above. As will be appreciated by those skilled in the art, the gradient field elements in an open MRI system will generally include one or more conductive elements laid onto a support substrate to define a specific pattern which generates the desired gradient field in response to the control pulses applied during an examination sequence. The conductive elements used to generate each gradient field may have unique configurations generally known in the art and which are beyond the scope of the present description. Similarly, the element assembly 88 includes a primary magnet structure 24 which may include a superconductive magnet and core elements for shaping or otherwise manipulating the primary magnetic field in a manner generally known in the art. The assembly is capped by a patient interface 90 which may be formed of any suitable material, such as a fiberglass and resin composite. The assembly is housed within a primary magnet core or support structure 92 which forms a recess 94 in which the assembly rests. The various elements of the assembly may be appropriately positioned and oriented during manufacture by one or more shimming elements, such as elements 96 and 98 in the implementation illustrated in FIG. 4. In general, such shims, which may consist of small iron pallets, serve to shape the magnetic field, and to render the magnetic field as homogeneous as possible.

It has been found, in the present technique, that enhanced performance and reduction in loss of RF energy can be obtained through the provision of a shield structure which substantially wraps around or surrounds both the gradient field elements and the primary magnet and its core and supports. In the implementation in FIG. 4, the RF shield, designated generally by reference numeral 100, includes a first, disk-like element 102 which is provided between the RF element 32 and the series of gradient field elements 26, 28 and 30. A skirt-like section 104 extends around the primary magnet core and its support to provide lateral shielding. The central or disk-like element 102 and the skirt-like element 104 are joined by a series of flexible fingers 106 which extend from the disk-element 102 to the inner periphery of the skirt-like element 104.

Any suitable configuration and materials may be used for the various parts of the RF shield in accordance with the present technique. For example, in a present embodiment, the disk-like element 102 is formed of one or more conductive patterns of copper which are supported on a substrate. In practice, the RF shield need not be a single conductive layer, but may have openings or voids, and multiple layers with capacitances therebetween to avoid eddy currents from the gradient field elements. Alternative arrangements include a wire mesh, with the mesh being selected for the RF frequencies used in operation. The shielding elements thus appear as a solid shield at the RF frequencies, although they are not actually continuous in nature. The specific patterns, which need not be continuous over the surface covering the gradient field elements, is adapted to the RF frequency employed during examination sequences, typically on the order of 64 MHz. The skirt-like element 104 is also formed of copper sheet, which may be substantially continuous, and which wraps around the entire or substantially the entire primary magnet core and support.

The conductive fingers 106 extend upwardly from the disk-like element 102 and provide extensions which can be joined to the skirt-like element during manufacture. In a present implementation, the extensions are made of phosphor bronze and provide a resilient or springy protrusion which offers good contact when the components are tightly assembled. The joined elements of the RF shield thus form a unitary structure which prevents or substantially reduces the penetration of RF energy into the gradient field elements, primary magnet, and the related support structures over substantially the entire face of the elements as well as along the sides. As will be appreciated by those skilled in the art, the entire structure may be capped with a shroud or a shroud assembly in the finished product.

The foregoing design of the RF shield facilitates assembly of both the shield and the related gradient field and permanent magnet structures. Specifically, the disk-like element 102 may be provided with the extensions 106 and may be simply laid into place over the gradient field elements during assembly. Spacers 108 and 110 may then be provided to support the various components with respect to one another, with the conductive fingers or extensions 106 extending outwardly to the perimeter adjacent to the location where the skirt-like element 104 will be wrapped. Element 104 is then joined over the completed assembly in one or more pieces and compressively or otherwise joined to the extensions 106 to complete the structures. Final assembly of both the upper and lower structures of the scanner can then be completed in a conventional manner.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An open MRI system comprising:
   first and second magnetic field generating sets, each set including a primary magnet portion and gradient field portions;
   an RF field generating element disposed between the first and second field generating sets; and
   first and second RF shields incorporated into each of the first and second field generating sets respectively, each RF shield over a face section of the respective set and extending around a lateral section of a primary magnet portion of the respective set.

2. The system of claim 1, wherein each RF shield includes a generally planar portion covering over the face section of the respective set, and a generally cylindrical portion extending around the lateral section of the primary magnet portion of the respective set.

3. The system of claim 2, wherein the planar portion and the cylindrical portion of each RF shield are joined by conductive fingers.

4. The system of claim 1, wherein the RF shields are made of a metal assembly or mesh material.

5. The system of claim 4, wherein the metal assembly or mesh material includes copper sheeting.

6. The system of claim 1, wherein each RF shield is disposed over first, second and third gradient field generating elements of the respective set.

7. The system of claim 1, further comprising control circuitry for applying pulse sequences to the gradient field portions and to the RF generating element.

8. An RF shield for an open MRI system, the MRI system including a first and second magnetic field generating sets at opposed positions about a patient volume, each magnetic field generating set including a primary magnet, gradient field generating elements and an RF field generating element, the RF shield comprising:
    a first portion configured to be disposed over the gradient field generating elements of a field generating set; and
    a second portion forming a skirt around at least part of the primary magnet of the respective field generating set.

9. The shield of claim 8, wherein the first and second portions are formed of conductive sheets.

10. The shield of claim 9, wherein the conductive sheets comprise copper.

11. The shield of claim 8, wherein the first and second portions are joined to one another around a periphery of the first portion.

12. The shield of claim 11, wherein the first and second portions are joined by conductive fingers extending between the first and second portions.

13. The shield of claim 12, wherein the fingers are compressively joined to the second portion.

14. The shield of claim 8, wherein the first portion is generally planar.

15. A method for shielding RF magnetic fields in an open MRI system, the method comprising the steps of:
    disposing a first RF shield portion over a gradient field generating element set;
    disposing a second RF shield portion over lateral regions of a primary magnet structure; and
    conductively joining the first and second shield portions to one another.

16. The method of claim 15, further comprising the step of providing a generally planar first RF shield.

17. The method of claim 15, further comprising the step of providing a generally skirt-like second RF shield portion.

18. The method of claim 15, further comprising the step of conductively joining the first and second shield portions, such that the first and second shield portions are conductively joined by a plurality of conductive extensions.

19. The method of claim 18, further comprising the step of providing conductive extensions, such that the conductive extensions are contiguous with the first shield portions.

20. The method of claim 18, further comprising the step of compressively joining the conductive extensions to the second shield portion.

21. The method of claim 15, comprising the further step of disposing an RF field generating element over the first shield portion.

22. The method of claim 21, comprising the further step of disposing a patient interface over the RF field generating element.

23. A method for generating MRI data, the method comprising the steps of:
    generating controlled gradient fields first and second field sets disposed on opposite sides of a patient volume in the presence of a primary magnetic field;
    generating a controlled RF field within the patient volume;
    shielding the RF field from gradient field elements and from primary magnet structures within the first and second field sets; and
    detecting magnetic resonance signals resulting from the fields.

24. The method of claim 23, wherein the RF field is shielded by a plurality of shield portions disposed over each field set.

25. The method of claim 24, further comprising the step of providing an RF shield associated with each field set, such that the RF shield associated with each field set includes a first portion disposed adjacent to the gradient field elements and a second portion disposed around lateral regions of the primary magnet structure.

26. The method of claim 25, further comprising the step of conductively joining the first and second portions of each shield.

27. The method of claim 26, further comprising the step of providing conductive extensions, wherein the conductive extensions join the first and second portions of each shield.

28. The method of claim 27, wherein the step of providing conductive extensions includes providing conductive extensions, such that the conductive extensions project from the first portion.

29. The method of claim 26, wherein joining includes compressively joining.

30. The method of claim 23, wherein the RF field is generated by an RF field element disposed between the shield of each field set and a patient interface.

* * * * *